United States Patent
Mandal et al.

(10) Patent No.: US 12,164,841 B2
(45) Date of Patent: Dec. 10, 2024

(54) MEASURING THE CAPABILITY OF AIOps SYSTEMS DEPLOYED IN COMPUTING ENVIRONMENTS

(71) Applicant: Healtech Software India Pvt. Ltd., Bangalore (IN)

(72) Inventors: Atri Mandal, Bangalore (IN); Raja Shekhar Mulpuri, Bangalore (IN)

(73) Assignee: Healtech Software India Pvt. Ltd., Karnataka (IN)

( * ) Notice: Subject to any disclaimer, the term of this patent is extended or adjusted under 35 U.S.C. 154(b) by 638 days.

(21) Appl. No.: 17/447,448

(22) Filed: Sep. 13, 2021

(65) Prior Publication Data

US 2023/0008225 A1    Jan. 12, 2023

(30) Foreign Application Priority Data

Jul. 12, 2021   (IN) .............................. 202141031215

(51) Int. Cl.
| | |
|---|---|
| *G06F 30/20* | (2020.01) |
| *G06N 20/00* | (2019.01) |
| *G06Q 10/0639* | (2023.01) |
| *G06F 3/14* | (2006.01) |

(52) U.S. Cl.
CPC ............ *G06F 30/20* (2020.01); *G06N 20/00* (2019.01); *G06Q 10/0639* (2013.01); *G06F 3/14* (2013.01)

(58) Field of Classification Search
CPC ........... G06F 30/20; G06F 3/14; G06N 20/00; G06Q 10/0639
See application file for complete search history.

(56) References Cited

U.S. PATENT DOCUMENTS

2019/0087469 A1*   3/2019   Zhang ..................... G06F 17/18

OTHER PUBLICATIONS

Wang H, Zhang H. AIOPS prediction for hard drive failures based on stacking ensemble model. In2020 10th Annual Computing and Communication Workshop and Conference (CCWC) Jan. 6, 2020 (pp. 0417-0423). IEEE. (Year: 2020).*
Nedelkoski S, Cardoso J, Kao O. Anomaly detection and classification using distributed tracing and deep learning. In2019 19th IEEE/ACM international symposium on cluster, cloud and grid computing (CCGRID) May 14, 2019 (pp. 241-250). IEEE. (Year: 2019).*

* cited by examiner

*Primary Examiner* — Chuen-Meei Gan
(74) *Attorney, Agent, or Firm* — IPHORIZONS PLLC; Narendra Reddy Thappeta

(57) ABSTRACT

An aspect of the present disclosure facilitates measuring the capability of AIOps (Artificial Intelligence for IT operations) systems deployed in computing environments. In one embodiment, a first simulation of a target AIOps system is run using a first historical input set having a corresponding first actual output set of a first AIOps system different from the target AIOps system. A second simulation of a reference AIOps system is run using a second historical input set having a corresponding second actual output set of the same first AIOps system. A first and second accuracy scores are determined based on outputs of the first and second simulations and the corresponding first and second actual output sets. An enablement score representing a measure of the capability (in terms of accuracy of prediction) of the target AIOps system is generated based on the first accuracy score and the second accuracy score.

26 Claims, 9 Drawing Sheets

Input/Target Data

| AIOps System | AI Functionality | Business Vertical | SW/HW constraints | AI Models | Data Types Available | Data Occurrence |
|---|---|---|---|---|---|---|
| PM170 | Outlier Detection | Banking-Netbanking | GPU present | Univariate statistical models | Metric Data, Log Data | Weekdays available. Weekend not available. Data missing between 1pm-2pm every day. |
| 411 | 412 | 413 | 414 | 415 | 416 | 417 |

FIG. 4A

REFERENCE Systems

| AIOps System | AI Functionality | AI Models | Data Types | Data Occurrence |
|---|---|---|---|---|
| REF01 | Outlier Detection | Univariate, Multivariate, Workload-behavior correlation | Metric, Topology, Logs, Alerts | All days available without breaks |
| REF02 | Capacity Planning | ARIMA, Linear Regression, Prophet, LSTM, Attention based Models | Metric, Topology, Logs, Incidents | All days available without breaks |
| REF03 | Root Cause Analysis | Bayesian Networks, Granger Causality, Attention based models | Metric, Topology, Logs, Traces, Incidents | All days available without breaks |

461 → REF01
462 → REF02
463 → REF03

FIG. 4B

| HISTORICAL Systems | | | | | | |
|---|---|---|---|---|---|---|
| AIOps System | AI Functionality | Business Vertical | SW/HW constraints | AI Models | Data Types Available | Data Occurrence |
| SYS01 | Outlier Detection | Banking-Netbanking | GPU present | Univariate models | Metric Data, Topology, Log Data, Trace Data | All days available without breaks |
| SYS02 | Outlier Detection | Banking-Netbanking | GPU Absent | Univariate models | Metric Data, Topology, Log Data, Trace Data | All days available without breaks |
| SYS03 | Capacity Planning | Travel - Booking | GPU Absent | Multivariate models | Metric Data, Topology, Log Data, Trace Data | Weekdays available, Weekends and Holidays not available |
| SYS04 | Root Cause Analysis | Travel - Booking | GPU present | Multivariate models | Metric Data, Topology, Log Data, Trace Data | All days available without breaks |
| SYS05 | Outlier Detection | Travel - Booking | GPU Absent | Univariate models | Metric Data, Topology, Log Data, Trace Data | Weekdays available, Weekends and Holidays not available |

| SYS01 - Historical Input Set | | | | | | |
|---|---|---|---|---|---|---|
| Time | CPU_UTIL | MEMORY | DISK_IOREAD | DISK_IOWRITE | ... | CURRENT_OPEN_CURSORS | LOCKS_WAITS |
| 08/16/2021 00:01 | 28.8571 | 21 | 141.36 | 971.1 | ... | 59810 | 0 |
| 08/16/2021 00:02 | 13.068 | 31 | 212.2 | 24.3418 | ... | 59873 | 2 |
| 08/16/2021 00:03 | 16.792 | 54 | 112.5 | 38.405 | ... | 60772 | 0 |
| 08/16/2021 00:04 | 24.55 | 63 | 45.55 | 235.35 | ... | 61374 | 10 |
| 08/16/2021 00:05 | 22.52 | 86 | 564.5 | 153.8 | ... | 61771 | 19 |
| ... | ... | ... | ... | ... | ... | ... | ... |
| 08/16/2021 00:23 | 17.49 | 91 | 5025.5 | 92.6421 | ... | 61798 | 16 |
| 08/16/2021 00:24 | 33.102 | 70 | 602.54 | 87.0773 | ... | 61811 | 85 |

| SYS01 - Actual Output Set | | | | | | |
|---|---|---|---|---|---|---|
| Time | CPU_UTIL | MEMORY | DISK_IOREAD | DISK_IOWRITE | ... | CURRENT_OPEN_CURSORS | LOCKS_WAITS |
| 08/16/2021 01:01 | 25.7671 | 20 | 132.76 | 891.3 | ... | 60880 | 0 |
| 08/16/2021 01:02 | 14.168 | 29 | 230.2 | 25.4568 | ... | 57279 | 3 |
| 08/16/2021 01:03 | 15.998 | 53 | 109.9 | 37.709 | ... | 59982 | 0 |
| 08/16/2021 01:04 | 25.65 | 64 | 50.85 | 390.35 | ... | 62994 | 12 |
| ... | ... | ... | ... | ... | ... | ... | ... |

*FIG. 5B*

MEASURING THE CAPABILITY OF AIOps SYSTEMS DEPLOYED IN COMPUTING ENVIRONMENTS

PRIORITY CLAIM

The instant patent application is related to and claims priority from the co-pending India provisional patent application entitled, "MEASURING THE CAPABILITY OF AIOPS SYSTEMS DEPLOYED IN COMPUTING ENVIRONMENTS", Ser. No.: 202141031215, Filed: 12 Jul. 2021, which is incorporated in its entirety herewith.

BACKGROUND OF THE DISCLOSURE

Technical Field

The present disclosure relates to computing infrastructures and more specifically to measuring the capability of AIOps (Artificial Intelligence for IT operations) systems deployed in computing environments.

Related Art

Computing environments contain computing infrastructures and software applications deployed thereon for processing user requests. The computing infrastructures can be cloud infrastructures, enterprise infrastructures, a hybrid of cloud and enterprise infrastructures, as is well known in the relevant arts.

AIOps (AI for IT operations) systems are often deployed to aid in the management of the performance of such computing environments. Performance management entails examination of inputs (user requests), outputs (responses to user requests) and resource usage while generating the outputs from the inputs. The resources can be infrastructure resources such as compute/CPU, memory/RAM, disk/file storage, etc., or application resources such as database connections, application threads, etc.

AIOps systems typically employ artificial intelligence (AI) techniques such as deep learning (DL) or machine learning (ML) models for correlating the inputs/outputs/resource usage noted above for predicting possible issues with the computing environment. Examples of such issues may include degradation in performance, lack/shortage of resources for processing the user requests, etc. Such issues often need corrective actions to be performed.

It is therefore desirable that the AIOps system predict such issues in a timely manner and with reasonable accuracy. As such, there is a general need to measuring the capability (in terms of accuracy of prediction) of the AIOps systems deployed in computing environments.

BRIEF DESCRIPTION OF THE DRAWINGS

Example embodiments of the present disclosure will be described with reference to the accompanying drawings briefly described below.

FIG. 4A depicts portions of input data specifying the details of a target AIOps system in one embodiment.

FIG. 4B depicts portions of reference data specifying the details of reference AIOps systems in one embodiment.

FIG. 4C depicts portions of historical data specifying the details of historical AIOps systems in one embodiment.

FIGS. 5A and 5B together depicts portions of a historical data set maintained in one embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE EMBODIMENTS OF THE DISCLOSURE

1. Overview

Figure 1:
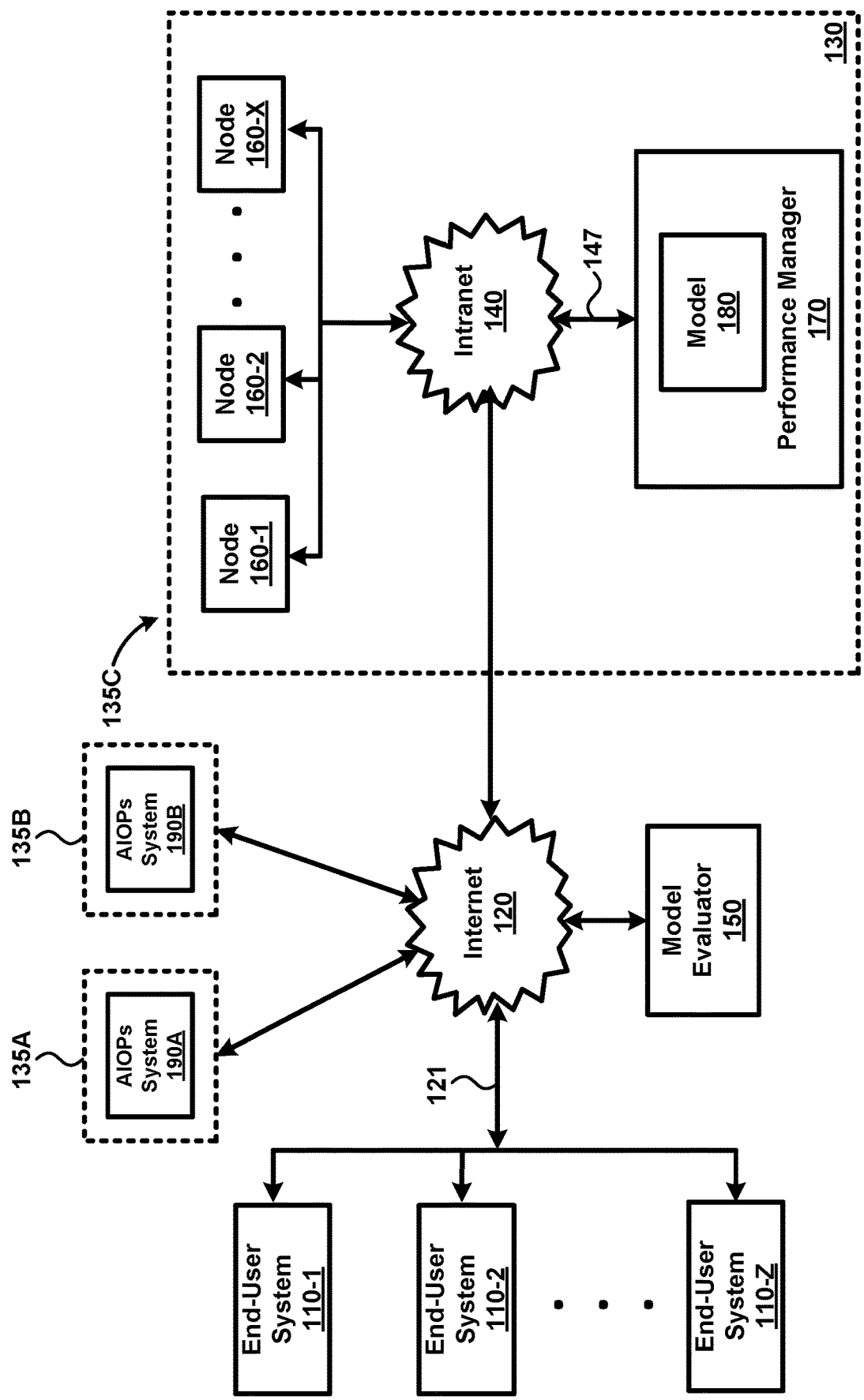
FIG. 1 is a block diagram illustrating an example environment in which several aspects of the present disclosure can be implemented.

An aspect of the present disclosure facilitates measuring the capability of AIOps (Artificial Intelligence for IT operations) systems deployed in computing environments. In one embodiment, a first simulation of a target AIOps system is run using a first historical input set having a corresponding first actual output set of a first AIOps system different from the target AIOps system. A first accuracy score is determined based on the outputs of the first simulation and the corresponding first actual output set. A second simulation of a reference AIOps system is run using a second historical input set having a corresponding second actual output set of the same first AIOps system. A second accuracy score is determined based on outputs of the second simulation and the corresponding second actual output set. An enablement score representing a measure of the capability (in terms of accuracy of prediction) of the target AIOps system is generated based on the first accuracy score and the second accuracy score.

According to another aspect of the present disclosure, a historical input superset and an actual output superset associated with the first AIOps system is maintained. The historical input superset includes values corresponding to multiple data types. The actual output superset includes actual values used for comparison with predicted values generated by the first AIOps system for the historical input superset. Upon identifying a subset of data types based on which the target AIOps system is operative, the values of the historical input superset corresponding to the subset of data types are selected as the first historical input set (noted above) and the corresponding values in the actual output superset are selected as the first actual output set (noted above). Also, the historical input superset is selected as the second historical input set (noted above) and the actual output superset is selected as the second actual output set (noted above).

According to one more aspect of the present disclosure, upon determining a first data occurrence of data processed by the target AIOps system, the first historical input set (noted above) is modified in line with the first data occurrence to form a first modified historical input set. The first simulation of the target AIOps system is run using the first modified historical input set.

According to yet another aspect of the present disclosure, upon detecting that the target AIOps system employs a first set of AI (artificial intelligence) models, the first simulation of the target AIOps system is run only for the first set of AI models, while the second simulation of the reference AIOps system is run for a second set of AI models which is a superset of the first set of AI models.

According to an aspect of the present disclosure, a reference data is maintained specifying for each of multiple reference AIOps systems, a corresponding set of AI models and an AI (artificial intelligence) functionality. The reference AIOps system (noted above) is selected from the multiple reference AIOps systems based on a first AI functionality of the target AIOps system sought to be measured. The corresponding set of AI models specified in the reference data for the reference AIOps system forms the second set of AI models (noted above).

It may be thus be appreciated that aspects of the present disclosure facilitate generating an enablement score for a specific AI functionality (such as Outlier detection, Capacity Forecasting, Root Cause Analysis (RCA) etc.) in an (target) AIOps system. The enablement score representing a measure of the capability of the AIOps system may be generated by taking into account the different dimensions like category of machine-learning/deep learning algorithms (AI models) currently enabled/employed in the AIOps system as well as the type and quality of data available to the AIOps system. Aspects are also directed to detecting the AI models currently employed in the target AIOps system and to determining the data quality based on factors like duration of data, data breakages (data occurrence) and types of data available.

According to another aspect of the present disclosure, upon receiving, from a user, an evaluation request for the target AIOps system, the actions of running the first simulation, determining the first accuracy score, running the second simulation, determining the second accuracy score and generating the enablement score are performed. The enablement score is then provided to the user as a response to the evaluation request.

According to an aspect of the present disclosure, the user is also provided with the first accuracy score as representing the current accuracy of the target AIOps system and the second accuracy score as representing a target accuracy of the target AIOps system.

According to one more aspect of the present disclosure, a historical data is maintained specifying for each historical AIOps system of multiple historical AIOps systems, a corresponding AI (artificial intelligence) functionality of the historical AIOps system and a corresponding business vertical to which the historical AIOps system is directed. The evaluation request also specifies an AI functionality of the target AIOps system sought to be measured and a business vertical to which the target AIOps system is directed. Accordingly, the first AIOps system is selected from the multiple historical AIOps systems based on the AI functionality and the business vertical of the target AIOps system specified in the evaluation request.

According to yet another aspect of the present disclosure, an analysis of one or more of the data types of the data processed by the target AIOps system and the reference AIOps system, the data occurrence of the data processed by the target AIOps system and the reference AIOps system, and the AI models employed by the target AIOps system and the reference AIOps system is performed. One or more suggestions for improving the enablement score are determined based on the analysis. The suggestions are provided to the user as part of the response to the evaluation request.

According to an aspect of the present disclosure, the evaluation request (received from the user) further specifies a computing constraint of the target AIOps system. The comparison noted above determines a first set of AI models for improving the enablement score. The first set of AI models is changed to a second set of AI models based on the computing constraint. The second set of AI models is incorporated in a first suggestion of the one or more suggestions noted above.

In one embodiment, the computing constraint indicates whether a Graphics Processing Unit (GPU) is present or absent in the target AIOps system. The first set of AI models includes ML (machine learning) based models and deep learning (DL) based models. Accordingly, the second set of AI models includes only the ML based models from the first set of AI models if the GPU is absent, and includes both of the ML based models and DL based models from the first set of AI models if the GPU is present.

Thus, aspects of the present disclosure highlight the current capability of the target AIOps system as well as provide suggestions on how the capability can be increased. The system also provides a target accuracy score under the current considerations and also provides suggestions on how to increase (without need for manual intervention) the enablement score based on analysis of the deployment/computing environment.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Environment

FIG. 1 is a block diagram illustrating an example environment in which several aspects of the present disclosure can be implemented. The block diagram is shown containing end-user systems 110-1 through 110-Z (Z representing any natural number), Internet 120, computing infrastructure 130 and model evaluator 150. Computing infrastructure 130 in turn is shown containing intranet 140, nodes 160-1 through 160-X (X representing any natural number) and performance manager 170 (containing model 180). In addition, the block diagram is shown containing computing environments 135A-135C and AIOps (Artificial Intelligence for IT operations) systems 190A-190B. The end-user systems and nodes are collectively referred to by 110 and 160 respectively.

Merely for illustration, only representative number/type of systems are shown in FIG. 1. Many environments often contain many more systems, both in number and type, depending on the purpose for which the environment is designed. Each block of FIG. 1 is described below in further detail.

Computing infrastructure 130 is a collection of nodes (160) that may include processing nodes, connectivity infrastructure, data storages, administration systems, etc., which are engineered to together host software applications. Computing infrastructure 130 may be a cloud infrastructure (such as Amazon Web Services (AWS) available from Amazon.

com, Inc., Google Cloud Platform (GCP) available from Google LLC, etc.) that provides a virtual computing infrastructure for various customers, with the scale of such computing infrastructure being specified often on demand.

Alternatively, computing infrastructure 130 may correspond to an enterprise system (or a part thereof) on the premises of the customers (and accordingly referred to as "On-prem" infrastructure). Computing infrastructure 130 may also be a "hybrid" infrastructure containing some nodes of a cloud infrastructure and other nodes of an on-prem enterprise system.

All the nodes (160) of computing infrastructure 130 are assumed to be connected via intranet 140. Internet 120 extends the connectivity of these (and other systems of the computing infrastructure) with external systems such as end-user systems 110. Each of intranet 140 and Internet 120 may be implemented using protocols such as Transmission Control Protocol (TCP) and/or Internet Protocol (IP), well known in the relevant arts.

In general, in TCP/IP environments, a TCP/IP packet is used as a basic unit of transport, with the source address being set to the TCP/IP address assigned to the source system from which the packet originates and the destination address set to the TCP/IP address of the target system to which the packet is to be eventually delivered. An IP packet is said to be directed to a target system when the destination IP address of the packet is set to the IP address of the target system, such that the packet is eventually delivered to the target system by Internet 120 and intranet 140. When the packet contains content such as port numbers, which specifies a target application, the packet may be said to be directed to such application as well.

Each of end-user systems 110 represents a system such as a personal computer, workstation, mobile device, computing tablet etc., used by users to generate (user) requests directed to software applications executing in computing infrastructure 130. A user request refers to a specific technical request (for example, Universal Resource Locator (URL) call) sent to a server system from an external system (here, end-user system) over Internet 120, typically in response to a user interaction at end-user systems 110. The user requests may be generated by users using appropriate user interfaces (e.g., web pages provided by an application executing in a node, a native user interface provided by a portion of an application downloaded from a node, etc.).

In general, an end-user system requests a software application for performing desired tasks and receives the corresponding responses (e.g., web pages) containing the results of performance of the requested tasks. The web pages/responses may then be presented to a user by a client application such as the browser. Each user request is sent in the form of an IP packet directed to the desired system or software application, with the IP packet including data identifying the desired tasks in the payload portion.

Some of nodes 160 may be implemented as corresponding data stores. Each data store represents a non-volatile (persistent) storage facilitating storage and retrieval of data by software applications executing in the other systems/nodes of computing infrastructure 130. Each data store may be implemented as a corresponding database server using relational database technologies and accordingly provide storage and retrieval of data using structured queries such as SQL (Structured Query Language). Alternatively, each data store may be implemented as a corresponding file server providing storage and retrieval of data in the form of files organized as one or more directories, as is well known in the relevant arts.

Some of the nodes 160 may be implemented as corresponding server systems. Each server system represents a server, such as a web/application server, constituted of appropriate hardware executing software applications capable of performing tasks requested by end-user systems 110. A server system receives a user request from an end-user system and performs the tasks requested in the user request. A server system may use data stored internally (for example, in a non-volatile storage/hard disk within the server system), external data (e.g., maintained in a data store) and/or data received from external sources (e.g., received from a user) in performing the requested tasks. The server system then sends the result of performance of the tasks to the requesting end-user system (one of 110) as a corresponding response to the user request. The results may be accompanied by specific user interfaces (e.g., web pages) for displaying the results to a requesting user.

In one embodiment, software applications containing one or more components are deployed in nodes 160 of computing infrastructure 130. Examples of such software include, but are not limited to, data processing (e.g., batch processing, stream processing, extract-transform-load (ETL)) applications, Internet of things (IoT) services, mobile applications, and web applications. Computing infrastructure 130 along with the software applications deployed there is viewed as a computing environment (135C).

It should be noted that in the disclosure herein, computing environment 135C includes computing infrastructure 130 and the software applications deployed thereon. Computing environments 135A and 135B are environments containing corresponding computing infrastructures (not shown) and software applications deployed thereon similar to computing environment 135A, and accordingly their description is not included here for conciseness.

It may be appreciated that each of nodes 160 has a fixed number of resources such as memory (RAM), CPU (central processing unit) cycles, persistent storage, etc. that can be allocated to (and accordingly used by) software applications (or components thereof) executing in the node. Other resources that may also be provided associated with the computing infrastructure (but not specific to a node) include public IP (Internet Protocol) addresses, etc. In addition to such infrastructure resources, application resources such as database connections, application threads, etc. may also be allocated to (and accordingly used by) the software applications (or components thereof). Accordingly, it may be desirable to monitor and manage the resources consumed by computing environment 135C.

Performance manager 170 is an AIOps system that aids in the management of the performance of computing environment 135C, in terms of managing the various resources noted above. Broadly, performance manager 170 is designed to process time series of values of various data types characterizing the operation of nodes 160 while processing user requests. The data types can span a variety of data, for example, performance metrics (such as CPU utilization, memory used, storage used, etc.), logs, traces, topology, etc. Based on processing of such values of potentially multiple data types, performance manager 170 predicts expected values of performance metrics of interest at future time instances, which forms the basis for identifying potential issues (shortage of resources, etc.) in computing environment 135C.

Model 180 represents a DL/ML model employed by performance manager 170 for performing such prediction. In one embodiment, the historical performance metrics along with the time instances at which they are collected (referred to as "training data") are provided as inputs to model 180. The specific DL/ML approach used in model 180 correlates the historical usage (input values) with the corresponding time instances and uses the correlation to predict/forecast the expected metrics values at future time instances. In the following disclosure, the data provided as inputs to performance manager 170 (in particular to model 180) is referred to as the "input set" or "input data set", the values predicted at future time instance is referred to as the "predicted set" or "predicted data set", while the actual values (determined at nodes 160) at the future time instances is referred to as the "actual output set" or "actual output data set".

AIOps systems 190A and 190B are systems similar to performance manger 170 that aid in the management of the performance of computing environments 135A and 135B respectively. It may be appreciated that each of AIOps systems 190A and 190B also operates on corresponding input data sets and predicts corresponding predicted sets and is associated with a corresponding actual output set.

Prior approaches provide a score for the machine learning models (180) but do not provide any information on whether the algorithm used is even applicable for the computing environment (135C) based on various practical considerations for software and hardware. For example, model 180 may be a state-of-the-art LSTM (Long Short-Term Memory) based model used for forecasting/predicting issues but the deployment environment (computing environment 135C) may not support GPU (graphics processing unit) or there may be a lack of labeled data. Also, the training data duration may not be sufficient for the ML algorithms to get the right amount of precision/recall/accuracy .

Model evaluator 150, provided according to several aspects of the present disclosure, facilitates measuring the capability of a AIOps system (performance manager 170) deployed in a computing environment (135C). Though shown external to computing infrastructure 130, in alternative embodiments, model evaluator 150 may be implemented internal to computing infrastructure 130, for example, on one of nodes 160 or as a system connected to intranet 140. The manner in which model evaluator 150 facilitates measuring the capability of a AIOps system is described below with examples.

3. Measuring the Capability of a AIOps System

Figure 2:
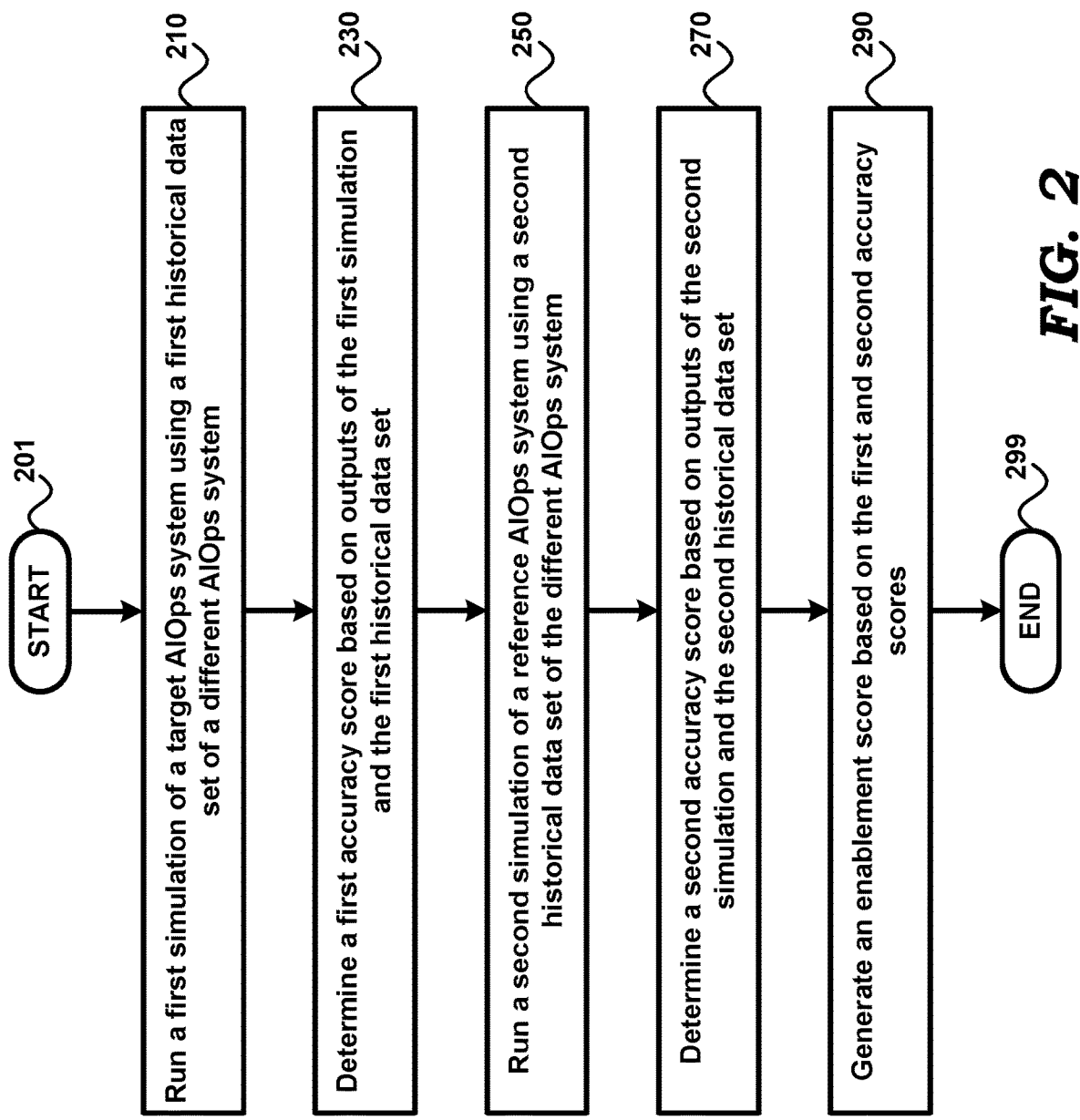
FIG. 2 is a flow chart illustrating the manner in which measuring the capability of a AIOps system deployed in a computing environment is facilitated according to aspects of the present disclosure.

FIG. 2 is a flow chart illustrating the manner in which measuring the capability of a AIOps system (performance manager 170) deployed in a computing environment (135C) is facilitated according to aspects of the present disclosure. The flowchart is described with respect to the systems of FIG. 1, in particular model evaluator 150, merely for illustration. However, many of the features can be implemented in other environments also without departing from the scope and spirit of several aspects of the present invention, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present invention. The flow chart begins in step 201, in which control immediately passes to step 210.

In step 210, model evaluator 150 runs a first simulation of a target AIOps system (here, performance manager 170) using a first historical data set generated by a different (historical) AIOps system. Simulation of an AIOps system entails providing the desired set of data values as inputs to AI models that would be operative in the AIOPs system. Therefore, the outputs of such simulation would represent the (expected) outputs of the AIOps system for the inputs thus provided. Thus, the simulation of the target AIOps system is achieved by replicating the data types, data occurrence (as inputs) and the AI models used in the target AIOps system.

The different (historical) AIOps system may be selected in any convenient manner. In one embodiment, the historical AIOps system is one of AIOps systems 190A-190B. According to an aspect, a historical data specifying the details of multiple historical AIOps systems is maintained. The historical AIOps system (for example, AIOps system 190A) is then selected based on an AI functionality (such as Outlier detection, Capacity Forecasting, Root Cause Analysis (RCA), etc.) of the target AIOps system sought to be measured and a business vertical (such as "Banking", "Travel", etc.) to which the target AIOps system is directed. In other words, the first historical data set that would be similar to the data set encountered by the target AIOps system (performance manager 170) is selected for the first simulation.

The first historical data set (associated with the historical AIOps system, that is AIOps 190A) typically includes a first historical input set and a corresponding first actual output set. According to an aspect, a historical input superset including values corresponding to multiple data types and an actual output superset generated by the different AIOps system for the historical input superset is maintained. The first historical input set and the first actual output set are formed by selecting the values corresponding to a subset of data types based on which the target AIOps system is operative.

In step 230, model evaluator 150 determines a first accuracy score based on outputs of the first simulation and the first historical data set. It may be appreciated that the outputs of the first simulation represent the values predicted for future time instances by the target AIOps system. Such predicted values are then compared with the actual values (in the first actual output set) to determine an accuracy score in a known way. The first accuracy score represents a current accuracy of the target AIOps system (performance manager 170).

In step 250, model evaluator 150 runs a second simulation of a reference AIOps system using a second historical data generated by the different AIOps system. According to several aspects, the simulation of the reference AIOps system is performed by using a superset of the data types used by the target AIOps system, a data occurrence that is continuous and has no data breakages (a superset of the data occurrence of the target AIOps system) and a superset of the AI models used in the target AIOps system.

The reference AIOps system may be selected in any convenient manner. According to an aspect, a reference data specifying the details of multiple reference AIOps systems is maintained. The reference AIOps system is then selected based on an AI functionality (such as Outlier detection, Capacity Forecasting, Root Cause Analysis (RCA), etc.) of the target AIOps system sought to be measured.

The second historical data set typically includes a second historical input set and a corresponding second actual output set. According to an aspect, when a historical input superset including values corresponding to multiple data types and an actual output superset generated by the different AIOps system for the historical input superset is maintained, the historical input superset is selected as the second historical input set and the actual output superset is selected as the second actual output set.

In step 270, model evaluator 150 determines a second accuracy score based on outputs of the second simulation and the second historical data. It may be appreciated that the outputs of the second simulation represent the values predicted for future time instances by the reference AIOps system. Such predicted values are then compared with the actual values (in the second actual output set) to determine an accuracy score in a known way. The second accuracy score represents a target accuracy of the target AIOps system (performance manager 170).

In step 290, model evaluator 150 generates an enablement score based on the first and second accuracy scores determined above. The enablement score may be generated as a ratio of the first and second accuracy score, that is, as the ratio of the current accuracy to the target accuracy of the target AIOps system. As such, the enablement score represents a measure of the capability (in terms of accuracy of prediction) of the target AIOps system (performance manager 170). Control passes to step 299, where the flowchart ends.

Thus, model evaluator 150 facilitates measuring the capability of a AIOps system (performance manager 170) deployed in a computing environment (135C). According to an aspect, model evaluator 150 performs the steps of FIG. 2 in response to an evaluation request received from a user (using one of end user systems 110 or nodes 160). Model evaluator 150 then provides (for example, display on user interface) the generated enablement score to the user as a response to the evaluation request.

According to another aspect, model evaluator 150 analyzes one or more of the data types of the data processed by the target AIOps system and the reference AIOps system, the data occurrence of the data processed by the target AIOps system and the reference AIOps system, and the AI models employed by the target AIOps system and the reference AIOps system. Model evaluator 150 then determines one or more suggestions for improving the enablement score based on the analysis. The suggestions are provided to the user as part of the response to the evaluation request.

The manner in which model evaluator 150 provides several aspects of the present disclosure according to the steps of FIG. 2 is illustrated below with examples.

4. Illustrative Example

FIGS. 3, 4A-4C, 5A-5B, 6 and 7 illustrate the manner in which measuring the capability of a AIOps system (performance manager 170) deployed in a computing environment (135C) is facilitated in one embodiment. Each of the Figures is described in detail below.

Figure 3:
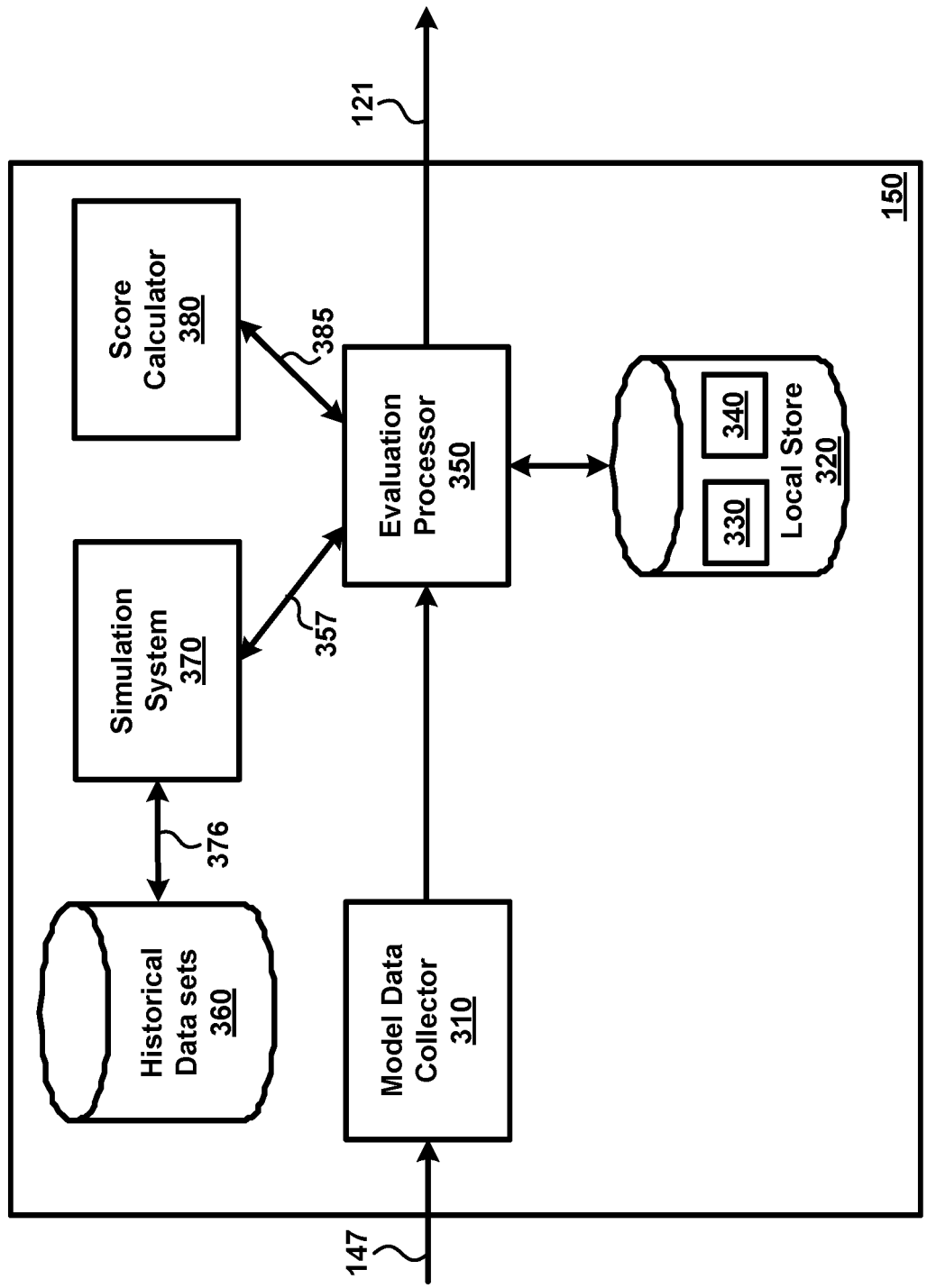
FIG. 3 is a block diagram illustrating an implementation of a model evaluator in one embodiment.

FIG. 3 is a block diagram illustrating an implementation of model evaluator (150) in one embodiment. The block diagram is shown containing target data collector 310, local store 320 (which in turn is shown containing reference data 330 and historical data 340), evaluation processor 350, historical data sets 360, simulation system 370 and score calculator 380. All the blocks are shown operating in model evaluator 150. Each of the blocks of the Figure is described in detail below.

Target data collector 310 collects data regarding the target AIOps system (performance manager 170). In one embodiment, target data collector 310 receives (via path 121) an evaluation request from a user using end user systems 110. The evaluation request indicates an identifier of the target AIOps system (performance manger 170), an AI functionality (such as Outlier detection, Capacity Forecasting, Root Cause Analysis (RCA), etc.) of the target AIOps system sought to be measured and a business vertical (such as "Banking", "Travel", etc.) to which the target AIOps system is directed. The evaluation request also indicates the computing constraints (software or hardware constraints) of the target AIOps system such as whether a GPU is present or absent in the target AIOps system, etc.

Target data collector 310 then interfaces (via path 147) with the target AIOps system (performance manager 170) to determine various dimensions of the target AIOps system. One dimension is the data types based on which the target AIOps system is operative. Target data collector 310 determines the types of data available, e.g., only metric data (Tier-1), topology (Tier-2), log data (Tier-2) and trace data (Tier-3). It may be appreciated that the availability of more data types entails that the target AIOps system would be able to predict values with more accuracy, while the availability of fewer data types reduces the accuracy of prediction.

Another dimension determined is the data occurrence (or quality of data) available to/processed by the target AIOps system. In particular, target data collector 310 determines the quality of data in terms of how many days of data available, whether the data has breakages, whether data is available for weekends, public holidays, etc.

Target data collector 310 also detects the set of AI models employed by the target AIOps system (another dimension). It may be appreciated that different sets of AI models may be employed by the target AIOps system for achieving the AI functionality (sought to be measured). For example, for outlier detection, the AI models may be univariate statistical models (Tier-1), multivariate models based on workload-behavior correlation (Tier-2), regression-based models (Tier-3), attention-based models (Tier-4), etc. Target data collector 310 detects the specific set of AI models currently employed in the target AIOps system (performance manager 170).

Target data collector 310 then forwards to evaluation processor 350 the details of the evaluation request such as the identifier of the target AIOps system, the AI functionality, business vertical, computing constraints, along with the detected set of AI models, the data types available and the determined data occurrence. The manner in which the details are forwarded is described below with examples.

FIG. 4A depicts portions of input data specifying the details of a target AIOps system in one embodiment. In particular, input table 400 depicts the details of performance manager 170 (as indicated by the identifier "PM170" in column 411) such as the AI functionality "Outlier Detection" sought to be measured (column 412), a business vertical "Banking-Netbanking" (column 413), computing constraints "GPU present" (column 414), the detected set of models "Univariate statistical models" (column 415), the data types available as "Metric Data, Log Data" (column 416) and the data occurrence as "Weekdays available. Weekend not available. Data missing between 1 pm-2 pm every day." (column 417).

Though shown in the form of tables, the input data (and the data of FIGS. 4B, 4C, 5A, and 5B) may be collected/maintained according to other data formats (such as extensible markup language (XML), etc.) and/or using other data structures (such as lists, trees, etc.), as will be apparent to one skilled in the relevant arts by reading the disclosure herein.

Referring again to FIG. 3, evaluation processor 350 receives the data of input table 400 from target data collector 310 and processes the input data. Evaluation processor 350 first selects a reference AIOps system based on reference data 330 and then selects a historical (first) AIOps system based on historical data 340. The manner in which reference data and historical data is maintained in local store 320 is described below with examples.

5. Reference Data, Historical Data and Historical Data Sets

Local store 320 represents a non-volatile (persistent) storage facilitating storage and retrieval of data and may be implemented as a database server or a file server, as is well known in the relevant arts. The description is continued assuming that local store 320 is implemented as a database server that facilitates the storage and retrieval of data in the form of tables.

FIG. 4B depicts portions of reference data specifying the details of reference AIOps systems in one embodiment. In particular, reference table 450 depicts portions of reference data 330 maintained in local store 320. It may be observed that the columns of reference table 450 are similar to the columns of input table 410, and accordingly their description is not repeated here for conciseness.

Each of rows 461-463 in reference table 450 specifies the details of a reference AIOps system corresponding to an AI functionality. For example, row 461 specifies the details of a reference AIOps system for the AI functionality "Outlier Detection". Similarly, the other rows specify the details for other AI functionalities.

FIG. 4C depicts portions of historical data specifying the details of historical AIOps systems (such as 190A and 190B) in one embodiment. In particular, historical table 470 depicts portions of historical data 340 maintained in local store 320. It may be observed that the columns of historical table 470 are similar to the columns of input table 410, and accordingly their description is not repeated here for conciseness.

Each of rows 481-485 in historical table 470 specifies the details of a corresponding historical AIOps system. For example, row 481 specifies the details of a historical AIOps system such as the identifier "SYS01", the AI functionality measured "Outlier Detection", a business vertical "Banking-Netbanking", computing constraints "GPU present", the set of models used "Regression based models", the data types used "Metric Data, Topology, Log Data, Trace Data" and the data occurrence as "All days available without breaks". Similarly, the other rows specify the details of other historical AIOps systems.

Referring again to FIG. 3, evaluation processor 350 inspects reference data 330 (reference table 450) and selects a reference AIOps system matching the AI functionality indicated in the input data. Thus, for the data of input table 400, evaluation processor 350 selects the AIOps system with identifier REF01 as the reference AIOps system in view of REF01 having the AI functionality "Outlier Detection" (as indicated by column 412).

It should be noted that the reference AIOps system uses a superset of the data types used by the target AIOps system, has a data occurrence that is continuous and has no data breakages (a superset of the data occurrence of the target AIOps system) and a superset of the AI models used in the target AIOps system. In the scenario that multiple AIOps systems have matching AI functionality, evaluation processor 350 may select any one of the matching AIOps systems as the reference AIOps system.

Evaluation processor 350 then inspects historical data 340 (historical table 470) and selects a historical AIOps system matching the combination of AI functionality and business vertical indicated in the input data. Thus, for the data of input table 400, evaluation processor 350 selects the AIOps system with identifier SYS01 as the reference AIOps system in view of SYS01 having the AI functionality "Outlier Detection" (as indicated by column 412) and business vertical "Banking-Netbanking" (as indicated by column 413).

It may be appreciated that the selected historical AIOps system typically uses a superset of the data types used by the target AIOps system, and has a data occurrence that is continuous and has no data breakages (a superset of the data occurrence of the target AIOps system). In the scenario that multiple AIOps systems have matching combination of AI functionality and business vertical (e.g., SYS02 and SYS05), evaluation processor 350 may select each of the matching AIOps systems as the historical AIOps system and perform the simulation of the target AIOps with the data sets of each of the matching AIOps systems as described in detail in the below sections.

Historical data sets 360 represents a non-volatile storage (similar to local store 320) that maintains the data sets associated with each of the historical AIOps systems maintained in historical data 340. As noted above, each historical data set consists of an historical input set which represents the values provided as inputs to the AI models of the corresponding historical AIOps system and a corresponding actual output set which represents the actual values used for comparison with (to check against) the predicted values generated by the AI models of the corresponding historical AIOps system. The manner in which the historical data sets 360 is maintained in an embodiment is described below with examples.

As noted above, a historical data set typically includes data values of different data types such as metric data, topology, log data, trace data, etc. As is well known, metric data refers to performance metric values collected from nodes 160 and is typically viewed as a time sequence of data value. Topology captures the relationships (invocations/execution paths) of various components of a single software application or multiple software applications. The topology generally is in the form of a JSON (JavaScript Object Notation) file showing the connections between individual services/components (vertical topology) and also may have information about which service/component is running on which instance(s)/nodes (horizontal topology).

Log data captures the various steps of processing of user requests by software applications of components thereof. Log data is typically in the form of data files stored in the disk or distributed file system. Examples are Tomcat™ logs, syslogs, access logs, application runtime logs, etc. Trace data captures the internal states of the software applications (or components thereof) while processing user requests. Trace data typically is a sequence specifying how much time a transaction spent on each service/component in the transaction flow path. An example of trace data is the data generated by OpenTelemetry™. For illustration, only sample metric data forming part of historical data set is described below with examples.

FIGS. 5A and 5B together depicts portions of a historical data set (specifically metric data) maintained in one embodiment. In particular, historical data tables 500 and 550 respectively depict the historical input set and the actual output set for the historical AIOps system SYS01.

In one embodiment, historical data tables 500 and 550 depict metric data captured for different block durations of 1 minute each. It should be appreciated that the block duration can be of fixed or variable time span, even though the embodiments below are described with respect to a fixed time span (e.g., one minute). Similarly, block durations can be non-overlapping time spans (as in the embodiments described below) or overlapping (e.g., sliding window).

In historical data tables 500 and 550, the columns indicate the resources such as "CPU_UTIL", "MEMORY", etc., while the rows indicate the block durations of one minute each. Each cell (at the intersection of a row and a column) thus indicates the resource consumption metric for the corresponding resource in respective block duration. For example, historical data table 500 indicates that the # (number) of DISK IO write operations performed in the block duration "8/16/2021 0:05" (that is from "0:04" to "0:05") is 153.8.

It should be noted that historical data table 500 includes the resource consumption metrics provided as inputs to the AI models used in the historical AIOps system SYS01. Historical data table 550 includes the actual values used for comparison with the predicted values generated by the AI models of the historical AIOps system SYS01 and accordingly is shown for future time instances (in comparison to the time instance shown in historical data table 500) such as "08/16/2021 01:04".

It may be appreciated that the values depicted in historical data tables 500 and 550 represent the resource consumption metrics for one or more software applications deployed in a computing environment of the historical AIOps system SYS01. However, in alternative embodiments, similar tables may be generated/maintained for each software application and/or different components of a single software application. In addition, the resource consumption metrics for all components of a single software application may be tallied to generate resource consumption metrics for the single software application as a whole.

It may be further appreciated that for a performance metric (such as CPU_UTIL), the various values in the corresponding column may be viewed as a time series. When an AI functionality (such as Outlier Detection) is based only on the previously observed values (historical data) of the resource consumption metric, such a time series is referred to as a univariate time series. This is in contrast to multivariate time series, where an AI functionality is based on multiple time series (e.g., Capacity Planning, which is dependent on multiple resource consumption metric time series such as CPU_UTIL and MEMORY). Aspects of the present disclosure are directed to both univariate and multivariate time series.

Referring again to FIG. 3, evaluation processor 350 after selecting the reference AIOps system and the historical AIOps system then runs simulations of the target AIOps system and the selected reference AIOps system based on the historical data set of the selected historical AIOps system. Accordingly, evaluation processor 350 first forwards the input data (input table 400) and details of the selected historical AIOps system to simulation system 370 for running a first simulation of the target AIOps system. The manner in which simulation system 370 runs the first simulation of the target AIOps system is described below with examples.

6. Simulation System

Figure 6:
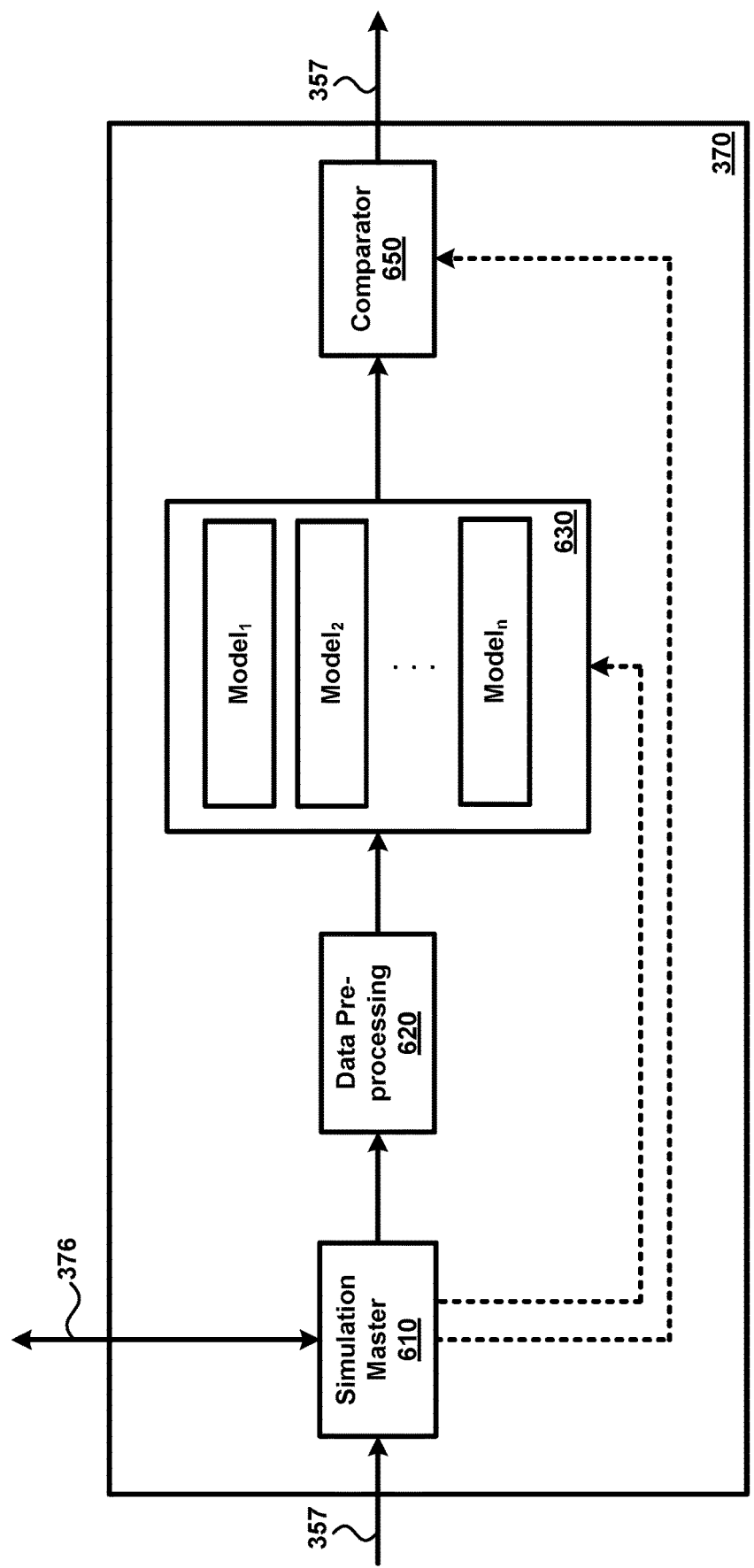
FIG. 6 is a block diagram illustrating an implementation of a simulation system in one embodiment.

FIG. 6 is a block diagram illustrating an implementation of a simulation system (370) in one embodiment. The block diagram is shown containing simulation master 610, data pre-processing 620, models 630 (in turn shown containing Model-1, Model-2 . . . Model-n) and comparator 650. All the blocks are shown operating in simulation system 370. Each of the blocks of the Figure is described in detail below.

Simulation master 610 receives (via path 357) the input data (input table 400) containing the details of the target AIOps system (PM170) and the details of the selected historical AIOps system (SYS01) from evaluation processor 350. Simulation master 610 then retrieves (via path 376) the historical data set corresponding to the selected historical AIOps system (SYS01) from historical data sets 360.

According to an aspect, the retrieved historical data set for SYS01 may include a historical input superset (historical table 500) and an actual output superset (historical table 550). The historical input superset includes values corresponding to multiple data types (for SYS01, "Metric Data, Topology, Log Data, Trace Data"). Simulation master 610 then identifies that the target AIOps system is operative based on a subset of data types ("Metric Data, Log Data" as indicated by column 416). Accordingly, simulation master 610 includes only the values corresponding to the subset of data types as the historical input set to be used for simulation of the target AIOps system. Simulation master 610 also selects corresponding values in the actual output superset as the actual output set to be used for simulation of the target AIOps system.

According to another aspect, simulation master 610 determines a data occurrence of data processed by the target AIOps system, that is, "Weekdays available. Weekend not available. Data missing between 1 pm-2 pm every day." as indicated by column 417. Simulation master 610 accordingly modifies the historical input set in line with the determined data occurrence to form a modified historical input set to be used for simulation of the target AIOps system. For example, for the values shown in historical data table 500, simulation master 610 may remove the rows depicting the block durations during weekends and also between 1 pm-2 pm every day.

According to one more aspect, simulation master 610 also determines based on the input data that the target AIOps system employs only a specific set of AI models ("Univariate statistical models" as indicated by column 415) and accordingly runs the simulation of the target AIOps system only for the specific set.

Simulation master 610 after determining the historical input set (or the modified historical input set), the actual output set and the specific set of AI models to be used for simulation of the target AIOps system, forwards the historical input set (or the modified historical input set) to data pre-processing 620, the specific set of AI models to models 630 (as indicated by a dotted arrow) and the actual output set to comparator 650 (again indicated by a dotted arrow).

Data pre-processing 620 receives the historical input set (or the modified historical input set) from simulation master 610, performs pre-processing on the received data (e.g., cleaning the data, removal of unexpected values, imputing missing values, etc.) identifies features and forwards the processed data and features to models 630.

Models 630 represents various machine learning (ML) or deep learning (DL) based models that correlates the received input data set with the corresponding time instances. The models (Model-1, Model-2, etc.) may be generated using any machine learning approaches such as KNN (K Nearest Neighbor), Decision Tree, etc. or deep learning approaches such as Multilayer Perceptron(MLP), Convolutional Neural Networks(CNN), Long short-term memory networks (LSTM) etc. Various other machine/deep learning approaches can be employed, as will be apparent to skilled practitioners, by reading the disclosure provided herein. In an embodiment, supervised machine/deep learning approaches are used.

As noted above, when performing the simulation of the target AIOps system, the models (Model-1, Model-2, etc.) use only the machine/deep learning approaches used in the target AIOps system. Thus, for the target AIOps system PM170, models 630 includes only univariate statistical models.

The input data set is fed into each of the models (Model-1, Model-2, etc.) individually and the models learn in parallel. In other words, the weights of the models are trained based on the input data set according to the specific ML/DL approach implemented in each model. Each model then generates/predicts values (predicted values) of the resource consumption metrics for future time instances based on the training, as is well known in the relevant arts. The predicted values of models 630 are forwarded to comparator 650.

Comparator 650 receives the various predicted values generated by models 630 and compares them with the actual output set received from simulation master 610 to determine an accuracy of prediction of models 630. Any accuracy measurement such as F1 score, Precision, Recall, False Positive Ratio (FPR), Mean Absolute Error, Mean Squared Error, Area Under Curve (AUC) etc. well known in the relevant arts may be conveniently chosen, though the description is continued with F1 scores as the accuracy measure. F1 score is a harmonic mean of the precision and recall, and is a measure of the accuracy of the corresponding simulation, as is well known in statistical analysis. It may be appreciated that the determined accuracy of prediction represents the current accuracy of the target AIOps system PM170 (performance manager 170). Comparator 650 provides (via path 357) the determined accuracy score of the target AIOps system to evaluation processor 350.

Referring again to FIG. 3, evaluation processor 350 receives the accuracy score determined for the simulation of the target AIOps system PM1070 and then performs a second simulation of the previously selected reference AIOps system REF01. Accordingly, evaluation processor 350 forwards the details of reference AIOps system REF01 and details of the selected historical AIOps system SYS01 to simulation system 370 for running a second simulation of the reference AIOps system.

In response to run the second simulation, simulation master 610 retrieves the historical data set including the historical input set and actual output set corresponding to the historical AIOps system SYS01 (similar to the approach noted above for the simulation of target AIOps system). It may be however be appreciated that simulation master 610 may not perform any removal of data types or any removal of values in line with the data occurrence, as the reference AIOps system REF01 indicates that all data types have to be used and that the data occurrence is "All days available without breaks" (similar to SYS01). Simulation master 610 may also determine the specific set of models as including "Univariate statistical models, Regression based models, attention-based models" specified for REF01.

Data pre-processing 620, models 630 and comparator 650 operate similar to the operation noted above but with the historical input set, actual output set and the specific set of models corresponding to the reference AIOps system REF01. Comparator 650 determines and provides (via path 357) an accuracy score of the reference AIOps system REF01 to evaluation processor 350. It may be appreciated that the determined accuracy score represents a target accuracy score of the target AIOps system PM170 (performance manager 170).

Referring again to FIG. 3, evaluation processor 350 receives the accuracy score determined for the simulation of the reference AIOps system REF01 and then generates an enablement score based on the accuracy scores determined for the simulations of the target AIOps system PM170 and reference AIOps system REF01 as described below with examples.

7. Generating Enablement Score and Determining Suggestions

Figure 7:
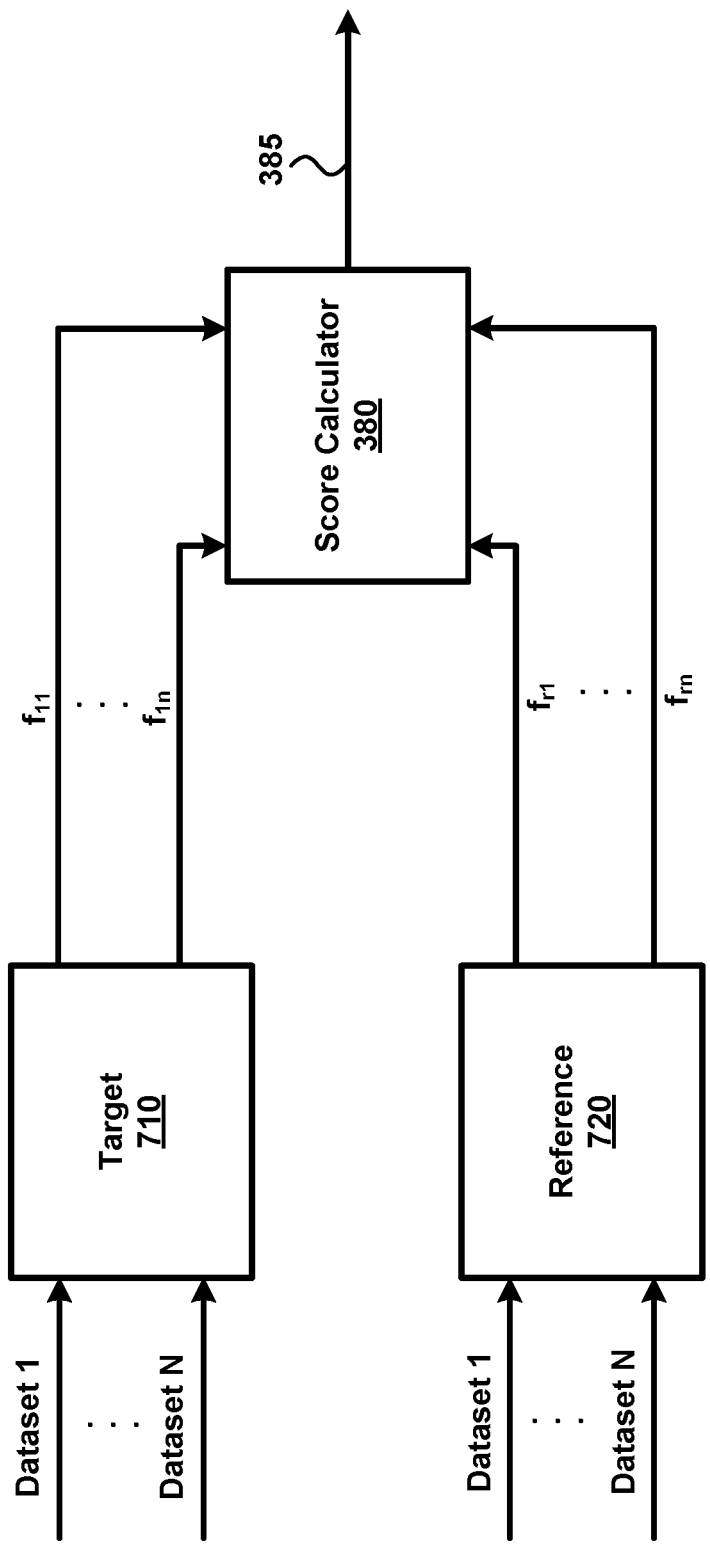
FIG. 7 illustrates the manner in which enablement score is generated in one embodiment.

FIG. 7 illustrates the manner in which enablement score is generated in one embodiment. In this regard, it is first noted that if any one of the dimensions (AI models, data types, data occurrence) is not configured or fully configured/enabled then the overall score for the AI functionality (Outlier Detection) will be "x". If all the dimensions are configured/enabled then the overall score will be "y". Here, it can be observed that x<=y. Also, ideally y should be equal to 100% and 0<=x<=100.

To implement the above, evaluation processor 350 first runs multiple simulations of the target AIOps system PM170 (performance manager 170) and the reference AIOps system REF01 using different historical data sets 1 . . . N. The different data sets may correspond to historical data sets of different historical AIOps systems or may correspond to different portions of the same historical data set of a selected historical AIOps system.

Target 710 represents simulations of the target AIOps system PM170, while reference 720 represents simulations of the reference AIOps system REF01. It should be noted that while target 710 has the dimensions configured similar to the target AIOps system, reference 710 is with full enablement (fully configured dimensions). It may be appreciated that the same datasets 1 . . . N are provided as inputs to both target 710 and reference 720. The outputs $f_{11}$ to $f_{1n}$ represent F1 scores determined corresponding to the different data sets for target 710, while the outputs and $f_{r1}$ to $f_m$ represent F1 scores determined corresponding to the different data sets for reference 720. The output F1 scores are provided by evaluation processor 350 to score calculator 380.

Score calculator 380 receives the F1 scores determined by target 710 and reference 720 and first calculates the mean score for the target AIOps system PM170 as:

$$A(t) = \left(\sum_{i=i}^{n} X(i)\right)/n$$

where X(i) is the accuracy score with $i^{th}$ dataset ($f_{11}$ to $f_{1n}$ in FIG. 7).

Score calculator 380 also calculates the accuracy scores with full enablement (reference 720) based on the fully configured dimensions for the AI functionality. Then, average score for full enablement/reference AIOps system REF01 is:

$$A(r) = \left(\sum_{i=i}^{n} y(i)\right)/n$$

where Y(i) is the accuracy score with $i^{th}$ dataset ($f_{r1}$ to $f_m$ in FIG. 7)

Then, score calculator 380 calculates enablement score as:

$$E = \left[\frac{A(t)}{A(r)}\right] * 100$$

Score calculator 380 then forwards (via path 385) the generated enablement score to evaluation processor 350, which in turn may provide (via path 121) the enablement score to a user as a response to an evaluation request.

According to an aspect, evaluation processor 350 also determines suggestions for improving the enablement score and provides (via path 121) the determined suggestions to a user as part of the response to the evaluation request. Broadly, evaluation processor 350 looks at all the gaps in the target AIOps system by comparing it to the golden system (reference AIOps system) with all dimensions enabled having maximum accuracy score. In particular, evaluation processor 350 analyzes/compares one or more of the data types of the data processed by the target AIOps system and the reference AIOps system, the data occurrence of the data processed by the target AIOps system and the reference AIOps system, and the AI models employed by the target AIOps system and the reference AIOps system. Based on such comparisons, evaluation processor 350 determines a list of gaps in the target AIOps system (performance manager 170). For example, for performance manager 170, the list of suggestions may include using a more advanced AI algorithm, obtain more training data, ingestion of other data sources like traces or topology, fixing data breakage issue etc.

According to another aspect, the gaps identified (as indicated by the list of suggestions) are further refined using knowledge of software and hardware constraints (computing constraints) of the target AIOps system. For example, if GPU is absent, DL based models cannot be enabled for Capacity Planning, so evaluation processor 350 does not include suggestions for DL based models in the list of suggestions. Evaluation processor 350 provides suggestions based on only the computing constraints. The suggestions may then be ranked based on which suggestion will provide the highest increment in accuracy score.

It may be appreciated that in the above disclosure, only some of the dimensions as relevant to the AI functionality of "Outlier Detection" have been noted. However, the dimensions may be different for other AI functionalities, and aspects of the present disclosure may be provided in the context of calculating enablement scores for the other AI functionalities based on the other/different dimensions, as will be apparent to one skilled in the relevant arts by reading the disclosure herein.

For example, for the AI functionality "Early Warnings" the dimensions may be type of AI model enabled (e.g., Univariate/Workload-behavior correlation/Multivariate), type of metrics collected (how many metrics, how many instances etc.), whether logs and traces are available, data duration and data quality. For the AI functionality "Causation Analysis", the dimensions may be type of causal inferencing used (Statistical/ML/DL), availability of historical thresholds and event information (from databases), information on event sequences and time variations from problem/incident reports, topology/dependency map and forensic information; and data duration & consistency.

Thus, model evaluator 150 provides an AI enablement score for a certain AI functionality which is currently not provided by any existing system. Model evaluator 150 not only provides the AI enablement score but also provide suggestions on what an end user has to do to increase the enablement score. Also, the enablement score is automatically updated based on new information that is available and thus the end user can always refer to the enablement score and have an estimate of how much accuracy can be provided by the target AIOps system (performance manager 170).

It should be further appreciated that the features described above can be implemented in various embodiments as a desired combination of one or more of hardware, software, and firmware. The description is continued with respect to an embodiment in which various features are operative when the software instructions described above are executed.

8. Digital Processing System

Figure 8:
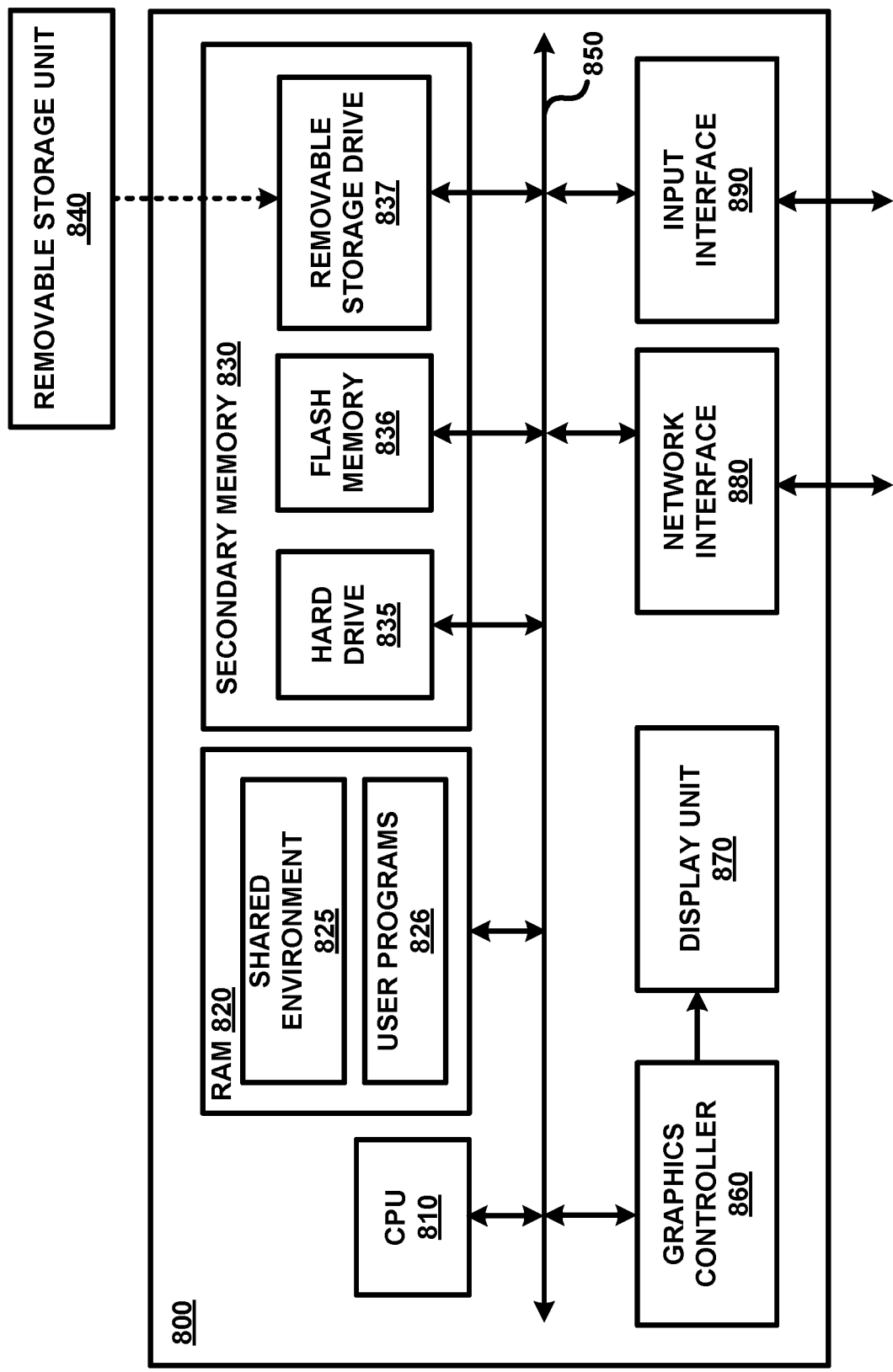
FIG. 8 is a block diagram illustrating the details of a digital processing system in which various aspects of the present disclosure are operative by execution of appropriate executable modules.

FIG. 8 is a block diagram illustrating the details of digital processing system (800) in which various aspects of the present disclosure are operative by execution of appropriate executable modules. Digital processing system 800 may correspond to model evaluator 150 (or any system implementing model evaluator 150).

Digital processing system 800 may contain one or more processors such as a central processing unit (CPU) 810, random access memory (RAM) 820, secondary memory 830, graphics controller 860, display unit 870, network interface 880, and input interface 890. All the components except display unit 870 may communicate with each other over communication path 850, which may contain several buses as is well known in the relevant arts. The components of FIG. 8 are described below in further detail.

CPU 810 may execute instructions stored in RAM 820 to provide several features of the present disclosure. CPU 810 may contain multiple processing units, with each processing unit potentially being designed for a specific task. Alternatively, CPU 810 may contain only a single general-purpose processing unit.

RAM 820 may receive instructions from secondary memory 830 using communication path 850. RAM 820 is shown currently containing software instructions constituting shared environment 825 and/or other user programs 826 (such as other applications, DBMS, etc.). In addition to shared environment 825, RAM 820 may contain other software programs such as device drivers, virtual machines, etc., which provide a (common) run time environment for execution of other/user programs.

Graphics controller 860 generates display signals (e.g., in RGB format) to display unit 870 based on data/instructions received from CPU 810. Display unit 870 contains a display screen to display the images defined by the display signals. Input interface 890 may correspond to a keyboard and a pointing device (e.g., touch-pad, mouse) and may be used to provide inputs. Network interface 880 provides connectivity to a network (e.g., using Internet Protocol), and may be used to communicate with other systems connected to the networks.

Secondary memory 830 may contain hard drive 835, flash memory 836, and removable storage drive 837. Secondary memory 830 may store the data (e.g., data portions of FIGS. 4A-4C and 5A-5B) and software instructions (e.g., for implementing the steps of FIG. 2, for implementing the blocks of FIGS. 3, 6 and 7), which enable digital processing system 800 to provide several features in accordance with the present disclosure. The code/instructions stored in secondary memory 830 may either be copied to RAM 820 prior to execution by CPU 810 for higher execution speeds, or may be directly executed by CPU 810.

Some or all of the data and instructions may be provided on removable storage unit 840, and the data and instructions may be read and provided by removable storage drive 837 to CPU 810. Removable storage unit 840 may be implemented using medium and storage format compatible with removable storage drive 837 such that removable storage drive 837 can read the data and instructions. Thus, removable storage unit 840 includes a computer readable (storage) medium having stored therein computer software and/or data. However, the computer (or machine, in general) readable medium can be in other forms (e.g., non-removable, random access, etc.).

In this document, the term "computer program product" is used to generally refer to removable storage unit 840 or hard disk installed in hard drive 835. These computer program products are means for providing software to digital processing system 800. CPU 810 may retrieve the software instructions, and execute the instructions to provide various features of the present disclosure described above.

The term "storage media/medium" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage memory 830. Volatile media includes dynamic memory, such as RAM 820. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 850. Transmission media can also take the form of acoustic or light waves, such as those generated during radio-wave and infra-red data communications.

Reference throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

Furthermore, the described features, structures, or characteristics of the disclosure may be combined in any suitable manner in one or more embodiments. In the above description, numerous specific details are provided such as examples of programming, software modules, user selections, network transactions, database queries, database structures, hardware modules, hardware circuits, hardware chips, etc., to provide a thorough understanding of embodiments of the disclosure.

9. Conclusion

While various embodiments of the present disclosure have been described above, it should be understood that they have been presented by way of example only, and not limitation. Thus, the breadth and scope of the present disclosure should not be limited by any of the above-described exemplary embodiments, but should be defined only in accordance with the following claims and their equivalents.

It should be understood that the figures and/or screen shots illustrated in the attachments highlighting the functionality and advantages of the present disclosure are presented for example purposes only. The present disclosure is sufficiently flexible and configurable, such that it may be utilized in ways other than that shown in the accompanying figures.

Further, the purpose of the following Abstract is to enable the Patent Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present disclosure in any way.

What is claimed is:

1. A non-transitory machine-readable medium storing one or more sequences of instructions for measuring the capability of Artificial Intelligence for IT operations (AIOps) systems deployed in computing environments, wherein execution of said one or more instructions by one or more processors contained in a digital processing system cause said digital processing system to perform the actions of:

receiving, from a user, an evaluation request for said target AIOps system; and in response to said receiving of said evaluation request:

running a first simulation of a target AIOps system using a first historical input set, wherein said first historical input set has a corresponding first actual output set of a first AIOps system different from said target AIOps system;

determining a first accuracy score based on outputs of said first simulation and said corresponding first actual output set;

running a second simulation of a reference AIOps system using a second historical input set having a corresponding second actual output set of said first AIOps system;

determining a second accuracy score based on outputs of said second simulation and said corresponding second actual output set;

generating an enablement score based on said first accuracy score and said second accuracy score, wherein said enablement score represents a measure of the capability of said target AIOps system;

analyzing one or more of the data types of the data processed by said target AIOps system and said reference AIOps system, the data occurrence of the data processed by said target AIOps system and said reference AIOps system, and the AI models employed by said target AIOps system and said reference AIOps system;

determining one or more suggestions to improve said enablement score based on said analyzing; and providing to said user, said enablement score and said one or more suggestions as a response to said evaluation request.

2. The non-transitory machine-readable medium of claim 1, further comprising one or more instructions for:

maintaining a historical input superset and an actual output superset associated with said first AIOps system, said historical input superset including values corresponding to a plurality of data types, wherein said actual output superset includes actual values used for comparison with predicted values generated by said first AIOps system for said historical input superset;

identifying a subset of data types based on which said target AIOps system is operative; and selecting values of said historical input superset corresponding to said subset of data types as said first historical input set and the corresponding values in said actual output superset as said first actual output set, wherein said selecting also selects said historical input superset as said second historical input set and said actual output superset as said second actual output set.

3. The non-transitory machine-readable medium of claim 2, further comprising one or more instructions for:
 determining a first data occurrence of data processed by said target AIOps system; and
 modifying said first historical input set in line with said first data occurrence to form a first modified historical input set,
 wherein said first simulation of said target AIOps system uses said first modified historical input set.

4. The non-transitory machine-readable medium of claim 3, further comprising one or more instructions for:
 detecting that said target AIOps system employs a first set of AI (artificial intelligence) models,
 wherein said first simulation of said target AIOps system is run only for said first set of AI models, wherein said second simulation of said reference AIOps system is run for a second set of AI models which is a superset of said first set of AI models.

5. The non-transitory machine-readable medium of claim 4, further comprising one or more instructions for:
 maintaining a reference data specifying for each of a plurality of reference AIOps systems, a corresponding set of AI models and an AI (artificial intelligence) functionality; and
 selecting said reference AIOps system from said plurality of reference AIOps systems based on a first AI functionality of said target AIOps system sought to be measured,
 wherein said corresponding set of AI models specified in said reference data for said reference AIOps system forms said second set of AI models.

6. The non-transitory machine-readable medium of claim 1, further comprising one or more instructions for
 performing said running first simulation, said determining said first accuracy score, said running said second simulation, said determining said second accuracy score and said generating said enablement score in response to said evaluation request.

7. The non-transitory machine-readable medium of claim 6, wherein said providing also provides to said user, said first accuracy score as representing the current accuracy of said target AIOps system and said second accuracy score as representing a target accuracy of said target AIOps system.

8. The non-transitory machine-readable medium of claim 6, further comprising one or more instructions for:
 maintaining a historical data specifying for each historical AIOps system of a plurality of historical AIOps systems, a corresponding AI (artificial intelligence) functionality of the historical AIOps system and a corresponding business vertical to which the historical AIOps system is directed,
 wherein said evaluation request also specifies an AI functionality of said target AIOps system sought to be measured and a business vertical to which said target AIOps system is directed; and
 selecting said first AIOps system from said plurality of historical AIOps systems based on said AI functionality and said business vertical of said target AIOps system specified in said evaluation request.

9. The non-transitory machine-readable medium of claim 6, wherein said evaluation request further specifies a computing constraint of said target AIOps system,
 wherein said analyzing determines a first set of AI models for improving said enablement score,
 further comprising one or more instructions for changing said first set of AI models to a second set of AI models based on said computing constraint,
 wherein said determining incorporates said second set of AI models in a first suggestion of said one or more suggestions.

10. The non-transitory machine-readable medium of claim 9, wherein said computing constraint indicates whether a Graphics Processing Unit (GPU) is present or absent in said target AIOps system,
 wherein said first set of AI models includes ML (machine learning) based models and deep learning (DL) based models,
 wherein said changing includes in said second set of AI models only said ML based models from said first set of AI models if said GPU is absent, and includes both of said ML based models and DL based models from said first set of AI models if said GPU is present.

11. A computer implemented method for measuring the capability of Artificial Intelligence for IT operations (AIOPs) systems deployed in computing environments, said method comprising:
 receiving, from a user, an evaluation request for said target AIOps system; and
 in response to said receiving of said evaluation request:
  running a first simulation of a target AIOps system using a first historical input set having a corresponding first actual output set of a first AIOps system different from said target AIOps system;
  determining a first accuracy score based on outputs of said first simulation and said corresponding first actual output set;
  running a second simulation of a reference AIOps system using a second historical input set having a corresponding second actual output set of said first AIOps system;
  determining a second accuracy score based on outputs of said second simulation and said corresponding second actual output set;
  generating an enablement score based on said first accuracy score and said second accuracy score, wherein said enablement score represents a measure of the capability of said target AIOps system;
  analyzing one or more of the data types of the data processed by said target AIOps system and said reference AIOps system, the data occurrence of the data processed by said target AIOps system and said reference AIOps system, and the AI models employed by said target AIOps system and said reference AIOps system;
  determining one or more suggestions to improve said enablement score based on said analyzing; and
  providing to said user, said enablement score and said one or more suggestions as a response to said evaluation request.

12. The method of claim 11, further comprising:
 maintaining a historical input superset and an actual output superset associated with said first AIOps system, said historical input superset including values corresponding to a plurality of data types, wherein said actual output superset includes actual values used for comparison with predicted values generated by said first AIOps system for said historical input superset;
 identifying a subset of data types based on which said target AIOps system is operative; and
 selecting values of said historical input superset corresponding to said subset of data types as said first historical input set and the corresponding values in said actual output superset as said first actual output set, wherein said selecting also selects said historical input superset as said second historical input set and said actual output superset as said second actual output set.

13. The method of claim 12, further comprising:
determining a first data occurrence of data processed by said target AIOps system; and
modifying said first historical input set in line with said first data occurrence to form a first modified historical input set,
wherein said first simulation of said target AIOps system uses said first modified historical input set.

14. The method of claim 13, further comprising:
detecting that said target AIOps system employs a first set of AI (artificial intelligence) models,
wherein said first simulation of said target AIOps system is run only for said first set of AI models, wherein said second simulation of said reference AIOps system is run for a second set of AI models which is a superset of said first set of AI models.

15. The method of claim 14, further comprising:
maintaining a reference data specifying for each of a plurality of reference AIOps systems, a corresponding set of AI models and an AI (artificial intelligence) functionality; and
selecting said reference AIOps system from said plurality of reference AIOps systems based on a first AI functionality of said target AIOps system sought to be measured,
wherein said corresponding set of AI models specified in said reference data for said reference AIOps system forms said second set of AI models.

16. The method of claim 11, further comprising:
performing said running said first simulation, said determining said first accuracy score, said running said second simulation, said determining said second accuracy score and said generating said enablement score in response to said evaluation request.

17. The method of claim 16, further comprising:
maintaining a historical data specifying for each historical AIOps system of a plurality of historical AIOps systems, a corresponding AI (artificial intelligence) functionality of the historical AIOps system and a corresponding business vertical to which the historical AIOps system is directed,
wherein said evaluation request also specifies an AI functionality of said target AIOps system sought to be measured and a business vertical to which said target AIOps system is directed; and
selecting said first AIOps system from said plurality of historical AIOps systems based on said AI functionality and said business vertical of said target AIOps system specified in said evaluation request.

18. The method of claim 16, wherein said evaluation request further specifies a computing constraint of said target AIOps system,
wherein said analyzing determines a first set of AI models for improving said enablement score,
said method further comprising changing said first set of AI models to a second set of AI models based on said computing constraint,
wherein said determining incorporates said second set of AI models in a first suggestion of said one or more suggestions.

19. A digital processing system comprising:
a random access memory (RAM) to store instructions for measuring the capability of Artificial Intelligence for IT operations (AIOPs) systems deployed in computing environments; and
one or more processors to retrieve and execute the instructions, wherein execution of the instructions causes the digital processing system to perform the actions of:
receiving, from a user, an evaluation request for said target AIOps system; and
in response to said receiving of said evaluation request:
running a first simulation of a target AIOps system using a first historical input set having a corresponding first actual output set of a first AIOps system different from said target AIOps system;
determining a first accuracy score based on outputs of said first simulation and said corresponding first actual output set;
running a second simulation of a reference AIOps system using a second historical input set having a corresponding second actual output set of said first AIOps system;
determining a second accuracy score based on outputs of said second simulation and said corresponding second actual output set;
generating an enablement score based on said first accuracy score and said second accuracy score, wherein said enablement score represents a measure of the capability of said target AIOps system;
analyzing one or more of the data types of the data processed by said target AIOps system and said reference AIOps system, the data occurrence of the data processed by said target AIOps system and said reference AIOps system, and the AI models employed by said target AIOps system and said reference AIOps system;
determining one or more suggestions to improve said enablement score based on said analyzing; and
providing to said user, said enablement score and said one or more suggestions as a response to said evaluation request.

20. The digital processing system of claim 19, further performing the actions of:
maintaining a historical input superset and an actual output superset associated with said first AIOps system, said historical input superset including values corresponding to a plurality of data types, wherein said actual output superset includes actual values used for comparison with predicted values generated by said first AIOps system for said historical input superset;
identifying a subset of data types based on which said target AIOps system is operative; and
selecting values of said historical input superset corresponding to said subset of data types as said first historical input set and the corresponding values in said actual output superset as said first actual output set,
wherein said selecting also selects said historical input superset as said second historical input set and said actual output superset as said second actual output set.

21. The digital processing system of claim 20, further performing the actions of:
determining a first data occurrence of data processed by said target AIOps system; and
modifying said first historical input set in line with said first data occurrence to form a first modified historical input set,
wherein said first simulation of said target AIOps system uses said first modified historical input set.

22. The digital processing system of claim 21, further performing the actions of:
  detecting that said target AIOps system employs a first set of AI (artificial intelligence) models,
  wherein said first simulation of said target AIOps system is run only for said first set of AI models, wherein said second simulation of said reference AIOps system is run for a second set of AI models which is a superset of said first set of AI models.

23. The digital processing system of claim 22, further performing the actions of:
  maintaining a reference data specifying for each of a plurality of reference AIOps systems, a corresponding set of AI models and an AI (artificial intelligence) functionality; and
  selecting said reference AIOps system from said plurality of reference AIOps systems based on a first AI functionality of said target AIOps system sought to be measured,
  wherein said corresponding set of AI models specified in said reference data for said reference AIOps system forms said second set of AI models.

24. The digital processing system of claim 19, further performing the actions of:
  performing said running said first simulation, said determining said first accuracy score, said running said second simulation, said determining said second accuracy score and said generating said enablement score in response to said evaluation request.

25. The digital processing system of claim 24, further performing the actions of:
  maintaining a historical data specifying for each historical AIOps system of a plurality of historical AIOps systems, a corresponding AI (artificial intelligence) functionality of the historical AIOps system and a corresponding business vertical to which the historical AIOps system is directed,
  wherein said evaluation request also specifies an AI functionality of said target AIOps system sought to be measured and a business vertical to which said target AIOps system is directed; and
  selecting said first AIOps system from said plurality of historical AIOps systems based on said AI functionality and said business vertical of said target AIOps system specified in said evaluation request.

26. The digital processing system of claim 24, wherein said evaluation request further specifies a computing constraint of said target AIOps system,
  wherein for said analyzing, said digital processing system determines a first set of AI models for improving said enablement score,
  said digital processing system further performing the actions of changing said first set of AI models to a second set of AI models based on said computing constraint,
  wherein for said determining, said digital processing system incorporates said second set of AI models in a first suggestion of said one or more suggestions.

* * * * *